United States Patent
Hayashi et al.

(10) Patent No.: US 9,525,118 B2
(45) Date of Patent: Dec. 20, 2016

(54) THERMOELECTRIC CONVERSION MATERIAL AND METHOD FOR PRODUCING THERMOELECTRIC CONVERSION MATERIAL

(75) Inventors: Sachiko Hayashi, Nagaokakyo (JP); Shuichi Funahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 44 days.

(21) Appl. No.: 13/584,845

(22) Filed: Aug. 14, 2012

(65) Prior Publication Data

US 2012/0305833 A1 Dec. 6, 2012

(30) Foreign Application Priority Data

Feb. 22, 2010 (JP) .................. 2010-036205

(51) Int. Cl.
*H01L 35/22* (2006.01)
*H01L 35/14* (2006.01)
*H01L 37/02* (2006.01)
*C04B 35/47* (2006.01)
*C22C 32/00* (2006.01)

(52) U.S. Cl.
CPC ............. *H01L 35/22* (2013.01); *C04B 35/47* (2013.01); *C22C 32/0026* (2013.01); *C22C 32/0089* (2013.01); *C04B 2235/3224* (2013.01); *C04B 2235/3227* (2013.01); *C04B 2235/3229* (2013.01)

(58) Field of Classification Search
CPC .......... H01L 35/14; H01L 35/22; H01L 35/28; H01L 37/00; H01L 37/02; H01L 37/04
USPC .............................................. 252/62.3 T, 513
See application file for complete search history.

(56) References Cited

U.S. PATENT DOCUMENTS

| 4,656,088 | A | * | 4/1987 | Tokunaga et al. | 428/323 |
| 6,007,743 | A | * | 12/1999 | Asada et al. | 252/513 |
| 6,316,100 | B1 | * | 11/2001 | Kodas et al. | 428/357 |
| 7,504,157 | B2 | * | 3/2009 | Huddleston et al. | 428/469 |

(Continued)

FOREIGN PATENT DOCUMENTS

| CN | 101542762 A | 9/2009 |
| EP | 1312433 * | 5/2003 |

(Continued)

OTHER PUBLICATIONS

Li. Synthesis and properties of Y-doped SrTiO3 as an anode material for SOFCs. Journal of Power Sources 166 (2007) 47-52.*

(Continued)

*Primary Examiner* — Matthew E Hoban
(74) *Attorney, Agent, or Firm* — Keating & Bennett, LLP

(57) ABSTRACT

An n-type thermoelectric conversion material that has a high Seebeck coefficient, a low electric resistivity, and a large power factor includes, as its main constituent, a metal material mainly containing Ni, and includes an oxide material containing Sr, Ti, and a rare-earth element in the range of about 10 wt % to about 30 wt %. The oxide material is a $SrTiO_3$ based oxide material. For producing the thermoelectric conversion material, through the steps of mixing and grinding a $SrTiO_3$ based oxide material and a Ni metal powder to prepare a mixture, forming this mixture into a shape to prepare a compact, and then firing the compact, the thermoelectric conversion material is obtained.

5 Claims, 3 Drawing Sheets

(56) References Cited

U.S. PATENT DOCUMENTS

| | | |
|---|---|---|
| 2002/0055002 A1 | 5/2002 | Toshima et al. |
| 2002/0069907 A1 | 6/2002 | Yamashita |
| 2010/0031993 A1 | 2/2010 | Uchida et al. |

FOREIGN PATENT DOCUMENTS

| | | |
|---|---|---|
| JP | 05-129667 A | 5/1993 |
| JP | 08-236818 A | 9/1996 |
| JP | 2006-179807 A | 7/2006 |
| JP | 2009-004542 A | 1/2009 |

OTHER PUBLICATIONS

Uematsu. Electrical properties of La-doped SrTiO3 (La: 0.1 to 2.0 at %) single crystals grown by xenon-arc image floating zone method. Journal of MAterials Science 19 (1984) 3671-3679.*

Official Communication issued in International Patent Application No. PCT/JP2011/053636, mailed on Apr. 26, 2011.

Official Communication issued in corresponding Chinese Patent Application No. 201180010208.6, mailed on Jun. 25, 2014.

\* cited by examiner

THERMOELECTRIC CONVERSION MATERIAL AND METHOD FOR PRODUCING THERMOELECTRIC CONVERSION MATERIAL

BACKGROUND OF THE INVENTION

1. Field of the Invention

The present invention relates to a thermoelectric conversion material and a method for producing the thermoelectric conversion material, and more particularly, a thermoelectric conversion material which has a higher Seebeck coefficient, a lower electric resistivity, and a larger power factor than conventional composite oxides, and a method for producing such a novel thermoelectric conversion material.

2. Description of the Related Art

In recent years, attention has been focused on thermoelectric conversion elements (thermoelectric conversion modules) capable of converting heat energy directly to electrical energy, as an effective technique for utilizing waste heat.

As thermoelectric conversion materials for use in these thermoelectric conversion elements, materials which use the Seebeck effect have been widely known conventionally.

Further, materials with a high Seebeck coefficient ($\alpha$) are desired because the voltage generated when a temperature difference is produced is preferably as high as possible in the case of the thermoelectric conversion materials (thermoelectric semiconductors).

In addition, the electric resistivity $\rho$ is desirably smaller because the high electric resistance (electric resistivity $\rho$) in a current flow causes energy to be lost by Joule heat.

The property of a thermoelectric conversion material is determined by the index defined by the following formula (1), which is referred to as a power factor (P.F.).

$$P.F.=\alpha^2/\rho \qquad (1)$$

From this point of view, a thermoelectric semiconductor element has been proposed which uses an oxide ceramic semiconductor composed of a composite oxide containing strontium and titanium as its main constituents and including therein scattered reducing substance phases which are not continuous with each other (See, for example, claim 1 in Japanese Patent Application Laid-Open No. 5-129667).

It is to be noted that examples of the scattered reducing substance phases are reported to include metal phases containing titanium, zirconium, tantalum, niobium, or the like as their main constituent, or metal carbide phases.

Further, Japanese Patent Application Laid-Open No. 5-129667 shows thermoelectric conversion materials with a Seebeck coefficient ($\alpha$) in the range of 120 µV/K to 197 µV/K and an electric conductivity in the range of 350/Ω·cm to 1010/Ω·cm (Table 1, and Table 2).

In this case, the power factor (P.F.) obtained for the thermoelectric conversion materials in Japanese Patent Application Laid-Open No. 5-129667 in accordance with the above formula (1) represents values of $5.8 \times 10^{-4}$ (No. 5 in Table 2) to $2.3 \times 10^{-3}$ W/K²m (No. 3 in Table 1), which are favorable properties at the time of filing. However, nowadays, thermoelectric conversion materials have been desired which have larger power factors.

In addition, as another thermoelectric conversion material, a thermoelectric conversion material has been proposed which is a composite oxide containing a strontium oxide and a titanium oxide as its main constituents, contains a rare-earth element and at least one or more elements selected from Nb, Ta, Sb, W, Si, Al, V, Cr, Mn, Fe, Co, Ni, Cu, and Zn, and has an electric conductivity of 100/Ω·cm or more (See, for example, claim 1 in Japanese Patent Application Laid-Open No. 8-236818).

The thermoelectric conversion material disclosed in Japanese Patent Application Laid-Open No. 8-236818 has a Seebeck coefficient in the range of −135 µV/K to −330 µV/K, and an electric conductivity in the range of 330/Ω·cm to 210/Ω·cm. The power factor (P.F.) obtained from these values in accordance with the above formula (1) represents values of $3.6 \times 10^{-3}$ (No. 12 in Table 1 of Japanese Patent Application Laid-Open No. 8-236818) to $4.5 \times 10^3$ W/K²m (No. 3 in Table 1 of Japanese Patent Application Laid-Open No. 8-236818). While these values of the power factor are larger than those in Japanese Patent Application Laid-Open No. 5-129667 mentioned above, thermoelectric conversion materials with much larger power factors have been desired nowadays as a matter of fact.

SUMMARY OF THE INVENTION

Accordingly, preferred embodiments of the present invention provide a thermoelectric conversion material which has a high Seebeck coefficient, a low electric resistance (electric resistivity $\rho$), and a large power factor, and a method for producing such a novel thermoelectric conversion material.

A thermoelectric conversion material according to a preferred embodiment of the present invention includes a metal material mainly containing Ni, and an oxide material containing Sr, Ti, and a rare-earth element in the range of about 10 wt % to about 30 wt %.

In the thermoelectric conversion material according to a preferred embodiment of the present invention, the oxide material is preferably a $SrTiO_3$ based oxide material.

In addition, a method for producing a thermoelectric conversion material according to a preferred embodiment of the present invention includes the steps of: preparing a $SrTiO_3$ based oxide powder; preparing a Ni metal powder; mixing and grinding the $SrTiO_3$ based oxide powder and the Ni metal powder to prepare a mixture; forming the mixture into a shape to prepare a compact; and firing the compact.

The thermoelectric conversion material according to a preferred embodiment of the present invention includes, as its main constituent, a metal material mainly containing Ni, and includes an oxide material containing Sr, Ti, and a rare-earth element in the range of about 10 wt % to about 30 wt %, thus making it possible to increase the Seebeck coefficient and decrease the electric resistance (electric resistivity), and making it possible to achieve a thermoelectric conversion material which has a large power factor.

In addition, in the thermoelectric conversion material according to a preferred embodiment of the present invention, the use of a $SrTiO_3$ based oxide material as the oxide material containing Sr, Ti, and a rare-earth element makes it possible to further ensure that a thermoelectric conversion material is achieved which has a high Seebeck coefficient, a low electric resistivity, and a large power factor.

It is to be noted that in the case of using a $SrTiO_3$ based oxide material ($SrTiO_3$ based material) as the oxide material, it is typically desirable to use a $SrTiO_3$ based oxide material in which Sr substituted with a rare earth, La, Ce, Dy, Er, or the like in the range of about 1 mol % to about 6 mol %. This material can further ensure that a thermoelectric conversion material is achieved which has favorable properties.

In addition, the method for producing a thermoelectric conversion material according to a preferred embodiment of the present invention includes the steps of: preparing a $SrTiO_3$ based oxide powder; preparing a Ni metal powder;

mixing and grinding the $SrTiO_3$ based oxide powder and the Ni metal powder to prepare a mixture; forming the mixture into a shape to prepare a compact; and firing the compact. Thus, a thermoelectric conversion material can be produced efficiently which has a high Seebeck coefficient, a low electric resistivity, and a large power factor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
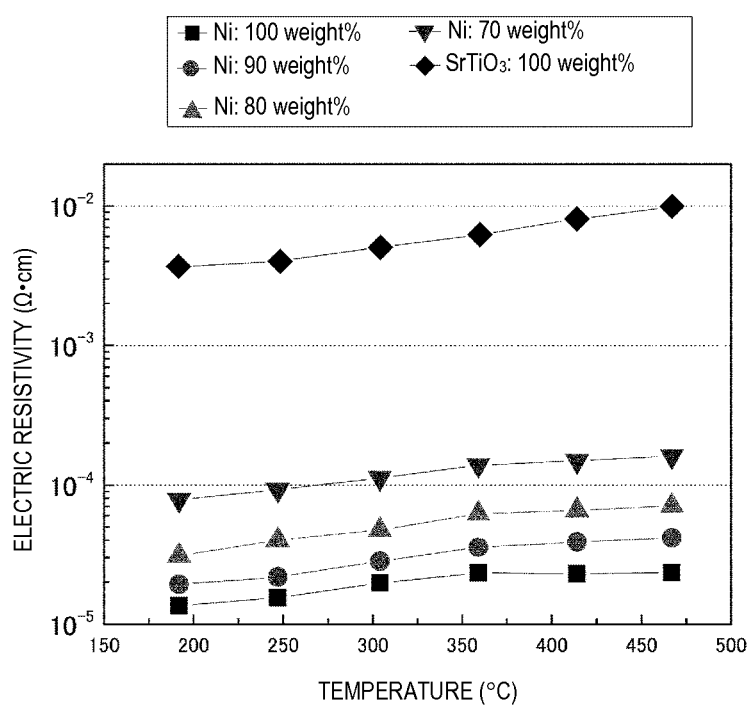
FIG. 1 is a diagram showing the relationship between electric resistivity and temperature for a sample according to an example of a preferred embodiment of the present invention and a sample for comparison.

With reference to examples of preferred embodiments of the present invention below, features of the present invention will be described in more details.

First Preferred Embodiment

According to a non-limiting example of a first preferred embodiment of the present invention, as an oxide material, a $SrTiO_3$ based oxide material was prepared by the following method.

First, respective powders of $SrCO_3$, $TiO_2$, $La_2O_3$, $CeO_2$, $Dy_2O_3$, and $Er_2O_3$ were prepared as starting raw materials for the $SrTiO_3$ based oxide material.

Then, these starting raw material powders were weighed so as to provide the compositions in Table 1. Then, the respective starting raw material powders and pure water as a solvent were combined, and subjected to mixing for 16 hours in a ball mill to obtain slurry. Next, the obtained slurry was dried, and then subjected to calcination under the condition of 1300° C. in the atmosphere.

Then, the calcined powder obtained was subjected to grinding and mixing with the use of a ball mill for 4 hours with ethanol as a solvent. Next, the slurry obtained by carrying out the grinding and mixing was mixed with the addition of organic constituents such as a binder and a dispersant to the slurry, and then formed into the shape of a sheet by a doctor blade method.

The prepared sheet was cut into a predetermined size, and stacked so as to obtain a predetermined thickness. Then, the laminated body was subjected to pressure bonding at a pressure of 200 MPa by an isostatic press method, thereby providing a compact.

The obtained compact was subjected to degreasing at 450° C., and then to firing at 1200 to 1400° C. to obtain a fired body.

Although this sintered body is a fired body of an oxide material containing no Ni based metal material, and not a thermoelectric conversion material which satisfies the requirements of the present invention, but a constituent thereof, the properties were evaluated by a method described below, for comparison with the thermoelectric conversion material according to an example of a preferred embodiment of the present invention.

First, the sintered body prepared in the way described above was cut to prepare samples for the evaluation of thermoelectric properties with dimensions of approximately 5 mm in length, 5 mm in width, and 10 mm in thickness, for example.

Then, for the samples, the electric resistivity in the temperature range of 190° C. to 450° C. was measured by a direct-current four-terminal method.

In addition, likewise, the Seebeck coefficient in the temperature range of 190° C. to 450° C. was discovered. It is to be noted that in this example, the Seebeck coefficient was obtained by, in the temperature range of 190° C. to 450° C., producing a temperature difference of 5° C. across both ends of the sample, thereby measuring the electromotive force, and making a calculation from the value.

In addition, the power factor P was calculated from the obtained Seebeck coefficient and electric resistivity. Table 1 shows the electric resistivity, Seebeck coefficient, and power factor at 250° C.

TABLE 1

| | | Thermoelectric Properties | | |
| --- | --- | --- | --- | --- |
| No. | Composition of $SrTiO_3$ based Material | Electric Resistivity ($\Omega \cdot cm$) | Seebeck coefficient ($\mu V/K$) | Power Factor ($w/K^2m$) |
| ST-0 | $SrTiO_3$ | 1.07 | — | — |
| ST-1 | $(Sr_{0.99}La_{0.01})TiO_3$ | $1.65 \times 10^{-2}$ | −395 | $9.46 \times 10^{-4}$ |
| ST-2 | $(Sr_{0.98}La_{0.02})TiO_3$ | $5.90 \times 10^{-3}$ | −290 | $1.43 \times 10^{-3}$ |
| ST-3 | $(Sr_{0.97}La_{0.03})TiO_3$ | $4.02 \times 10^{-3}$ | −247 | $1.52 \times 10^{-3}$ |
| ST-4 | $(Sr_{0.94}La_{0.06})TiO_3$ | $5.50 \times 10^{-3}$ | −204 | $7.57 \times 10^{-4}$ |
| ST-5 | $(Sr_{0.97}Dy_{0.03})TiO_3$ | $7.45 \times 10^{-3}$ | −273 | $1.00 \times 10^{-3}$ |
| ST-6 | $(Sr_{0.97}Ce_{0.03})TiO_3$ | $7.23 \times 10^{-3}$ | −268 | $9.93 \times 10^{-4}$ |
| ST-7 | $(Sr_{0.97}Er_{0.03})TiO_3$ | $7.45 \times 10^{-3}$ | −271 | $9.86 \times 10^{-4}$ |

From Table 1, it has been confirmed that the substitution of the Sr element in the $SrTiO_3$ with a rare-earth element such as La, Dy, Ce, and Er in the range of about 1 mol % to about 6 mol % allows the electric resistivity to be reduced by approximately 2 to 3 digits. It is to be noted that in the case of the sample ST-0 in Table 1 without the substitution of Sr with any rare-earth element, the Seebeck coefficient was not able to be measured because of the high electric resistivity.

In a non-limiting example of a process of preparing a thermoelectric conversation material, a Ni powder of 0.65 µm in average particle size was prepared.

Then, this Ni powder was weighed so as to have the proportions as shown in Table 2, and combined with the $SrTiO_3$ based oxide materials ST-1 to ST-4 in Table 1, which were prepared described above, thereby providing combined powders. However, the sample No. 1 in Table 2 is a sample of 100 weight % of Ni powder (a sample with no $SrTiO_3$ based oxide material combined).

Then, the combined powders were subjected to grinding and mixing for 4 hours in a ball mill with ethanol as a solvent to obtain mixture slurry. Next, the obtained mixture slurry was mixed with the addition of organic constituents such as a binder and a dispersant to the slurry, and this mixture (slurry) was formed into a desired shape of a sheet by a doctor blade method.

Then, the formed sheet was cut into a predetermined size, and stacked so as to obtain a predetermined thickness. The laminated body was subjected to pressure bonding at a pressure of 200 MPa by an isostatic press method, thereby providing a compact. The obtained compact was subjected to degreasing at 450° C., and then to firing under the condition of 1,150° C. to 1,350° C. in a reducing atmosphere to obtain a fired body.

The sintered body prepared in the way described above was cut to prepare samples with dimensions of approximately 5 mm in length, 5 mm in width, and 10 mm in thickness, for example.

Then, for the prepared samples (the respective samples of sample numbers 1 to 9 in Table 2), the electric resistivity and Seebeck coefficient were discovered in the temperature range of 190° C. to 450° C. by the same methods, and under the same conditions as in the case of the oxide materials described above, and the power factor was obtained.

Table 2 shows the electric resistivity, Seebeck coefficient, and power factor for the respective samples at 250° C.

In addition, it has been confirmed that, as shown in Table 2, the samples of sample Nos. 2 to 4 and 7 to 9 according to an example of a preferred embodiment of the present invention achieve larger power factors than the power factors of the sample of the Ni metal powder only (the sample of sample No. 1 in Table 2) and of the sample of the $SrTiO_3$ based material (the oxide material) only (the sample of sample No. 6 in Table 2).

In addition, it has been confirmed that when the combination ratio of the $SrTiO_3$ based oxide material is greater than about 30 wt % as in the case of the sample of sample No. 5 (the sample in which the combination ratio of the $SrTiO_3$ based oxide material is about 50 wt %) in Table 2, the electric resistivity is increased to decrease the power factor, even if the Seebeck coefficient can be ensured to some extent. Therefore, the combination ratio of the $SrTiO_3$ based oxide material for the Ni metal desirably falls within the range of about 10 wt % to about 30 wt % as the proportion of the $SrTiO_3$ based oxide material to the entire thermoelectric conversion material.

TABLE 2

| Sample No. | Ni Additive Amount (weight %) | Type of $SrTiO_3$ based Material | Additive Amount of $SrTiO_3$ based Material (weight %) | Electric Resistivity ($\Omega \cdot cm$) | Seebeck coefficient ($\mu V/K$) | Power Factor ($w/K^2m$) |
|---|---|---|---|---|---|---|
| *1 | 100 | — | 0 | $1.55 \times 10^{-5}$ | −17.1 | $1.89 \times 10^{-3}$ |
| 2 | 90 | ST-3 (La = 0.03) | 10 | $2.18 \times 10^{-5}$ | −36.0 | $5.94 \times 10^{-3}$ |
| 3 | 80 | ST-3 (La = 0.03) | 20 | $4.01 \times 10^{-5}$ | −65.9 | $1.08 \times 10^{-2}$ |
| 4 | 70 | ST-3 (La = 0.03) | 30 | $9.24 \times 10^{-5}$ | −59.9 | $3.88 \times 10^{-3}$ |
| *5 | 50 | ST-3 (La = 0.03) | 50 | $3.20 \times 10^{-4}$ | −76.5 | $1.83 \times 10^{-3}$ |
| *6 | 0 | ST-3 (La = 0.03) | 100 | $4.02 \times 10^{-3}$ | −247 | $1.52 \times 10^{-3}$ |
| 7 | 80 | ST-1 (La = 0.01) | 20 | $1.43 \times 10^{-4}$ | −90.8 | $5.77 \times 10^{-3}$ |
| 8 | 80 | ST-2 (La = 0.02) | 20 | $4.58 \times 10^{-5}$ | −70.2 | $1.08 \times 10^{-2}$ |
| 9 | 80 | ST-4 (La = 0.06) | 20 | $5.25 \times 10^{-5}$ | −49.4 | $4.65 \times 10^{-3}$ |

Figure 2:
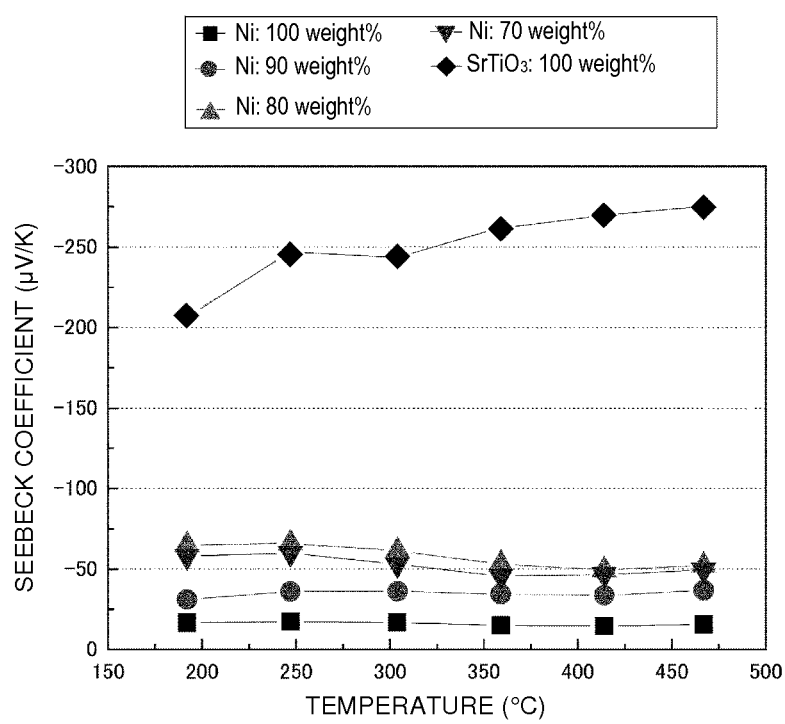
FIG. 2 is a diagram showing the relationship between Seebeck coefficient and temperature for a sample according to an example of a preferred embodiment of the present invention and a sample for comparison.
Figure 3:
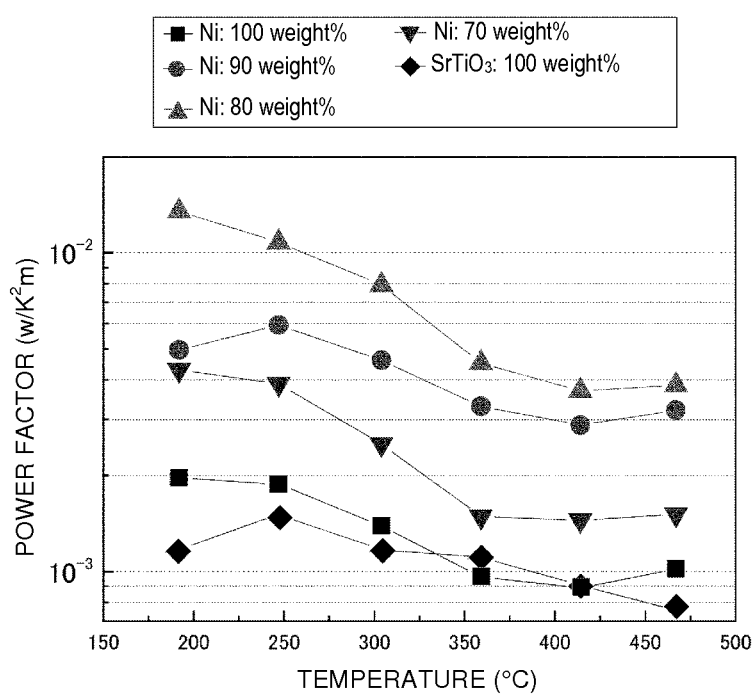
FIG. 3 is a diagram showing the relationship between power factor and temperature for a sample according to an example of a preferred embodiment of the present invention and a sample for comparison.

In addition, FIG. 1 shows the relationship between the electric resistivity and the temperature, FIG. 2 shows the relationship between the Seebeck coefficient and the temperature, and FIG. 3 shows the relationship between the power factor and the temperature. Further, FIGS. 1 to 3 show together the properties discovered for the oxide materials described above.

Provided below are the respective samples which have properties shown in FIGS. 1 to 3.

Sample of 100 weight % of Ni⇒ Sample of Sample No. 1 in Table 2

Sample with 90 weight % of Ni⇒ Sample of Sample No. 2 in Table 2

Sample with 80 weight % of Ni⇒ Sample of Sample No. 3 in Table 2

Sample with 70 weight % of Ni⇒ Sample of Sample No. 4 in Table 2

Sample of 100 weight % of $SrTiO_3$ (0 weight % of Ni)⇒ Sample of Sample No. 6 in Table 2 (Sample ST-3 of only $SrTiO_3$ based Material in Table 1)

As shown in FIGS. 1 to 3, it has been confirmed that the sample of 100 weight % of Ni (the sample of the Ni metal powder only) has a low electric resistivity (FIG. 1), but has a small absolute value for the Seebeck coefficient (FIG. 2), and as a result, has a small power factor (FIG. 3).

In addition, it has been confirmed that the sample of 100 weight % of $SrTiO_3$ based material (the oxide material only) has a large absolute value for the Seebeck coefficient (FIG. 2), but has a high electric resistivity (FIG. 1), and as a result, has a small power factor (FIG. 3).

In addition, it has been confirmed that in the case of using the $SrTiO_3$ based oxide material as the oxide material, the use of the material with Sr substituted with a rare-earth element, La, Ce, Dy, or Er in the range of about 1 mol % to about 6 mol % achieves a thermoelectric conversion material which has favorable properties.

While La, Ce, Dy, or Er was preferably used as the rare-earth element in this example, similar effects are believed to be produced even when other rare-earth elements are used.

In addition, while a case of the metal material substantially containing no other metals than Ni has been described in this example, the metal material may contain other metal constituents as long as the metal material contains Ni as its main constituent.

The present invention is not to be considered limited to the non-limiting examples of preferred embodiments of the present invention described above in other respects, and various applications and modifications can be made within the scope of the present invention, regarding the specific composition of the oxide material, the specific conditions in the respective steps (for example, the step of mixing and grinding raw material powders to prepare a mixture, the step of forming the mixture into a shape to prepare a compact, and the step of firing the compact) in the process for producing a thermoelectric conversion material according to various preferred embodiments of the present invention, etc.

What is claimed is:

1. A thermoelectric conversion element comprising:
a fired body obtained by firing a laminated body consisting of a plurality of sheets; wherein
each of the plurality of sheets includes:
a metal material mainly containing Ni as a main constituent; and
an oxide material containing Sr, Ti, and a rare-earth element in a range of greater than 10 wt % to about 30 wt %;
a portion of the Sr in the oxide material is substituted with the rare-earth element in a range of about 1 mol % to about 6 mol %; and
an electric resistivity of the thermoelectric conversion element is in a range of about $2.18 \times 10^{-5}$ ·cm to about $1.43 \times 10^{-4}$ ·cm.

2. The thermoelectric conversion element according to claim 1, wherein the oxide material is a $SrTiO_3$ based oxide material.

3. A method for producing a thermoelectric conversion material, the method comprising the steps of:
preparing a $SrTiO_3$ based oxide powder including a rare-earth element, a portion of the Sr in the $SrTiO_3$ based oxide powder being substituted with the rare-earth element in a range of about 1 mol % to about 6 mol %;
preparing a Ni metal powder;
mixing and grinding the $SrTiO_3$ based oxide powder and the Ni metal powder to prepare a mixture;
forming the mixture into a shape to prepare a compact; and
firing the compact; wherein
greater than 10 wt % to about 30 wt % of the $SrTiO_3$ based oxide powder is included in the mixture.

4. The thermoelectric conversion element according to claim 1, wherein the rare-earth element is selected from the group consisting of La, Dy, Ce, and Er.

5. The method for producing a thermoelectric conversion material according to claim 3, wherein the rare-earth element is selected from the group consisting of La, Dy, Ce, and Er.

* * * * *